United States Patent [19]

Uesugi et al.

[11] Patent Number: 6,153,009
[45] Date of Patent: Nov. 28, 2000

[54] METHOD FOR PRODUCING A SILICON SINGLE CRYSTAL AND THE SILICON SINGLE CRYSTAL PRODUCED THEREBY

[75] Inventors: Toshiharu Uesugi; Toshio Hisaichi; Izumi Fusegawa; Tomohiko Ohta, all of Fukushima-ken; Tetsuya Igarashi, Fukui-ken; Tetsuhiro Oda, Fukushima-ken, all of Japan

[73] Assignee: Shin-Etsu Handotai Co., Ltd., Tokyo, Japan

[21] Appl. No.: 09/270,277

[22] Filed: Mar. 16, 1999

[30] Foreign Application Priority Data

Mar. 17, 1998 [JP] Japan .................................. 10-088209
Mar. 24, 1998 [JP] Japan .................................. 10-095481

[51] Int. Cl.[7] .................................................. C30B 15/20
[52] U.S. Cl. ............................... 117/20; 117/13; 117/14
[58] Field of Search ................................... 117/13, 14, 20

[56] References Cited

U.S. PATENT DOCUMENTS

| 4,040,895 | 8/1977 | Patrick et al. | |
| 5,474,020 | 12/1995 | Bell et al. | 117/20 |
| 5,766,341 | 6/1998 | Kimbel et al. | 117/14 |
| 5,876,495 | 3/1999 | Hiraishi et al. | 117/20 |

FOREIGN PATENT DOCUMENTS

| 404160088 | 6/1992 | Japan | 117/20 |

*Primary Examiner*—Felisa Hiteshew
*Attorney, Agent, or Firm*—Hogan & Hartson, LLP

[57] ABSTRACT

In a Czochralski method for producing a silicon single crystal by growing the crystal, the pulling rate of the single crystal is gradually increased during formation of a tail part after formation of a predetermined or constant diameter part of the single crystal. The length t of the tail part is defined to be a or more, where a represents a distance from the tip end of the tail part to a position of an extraordinary oxygen precipitation area when the tail part is formed after the predetermined or constant diameter part is grown. Productivity and yield of the silicon single crystal are improved by preventing rapid change in temperature while the single crystal is separated from the melt in the tailing process, to suppress generation of an area where the amount of precipitated oxygen is extraordinarily large and an OSF ring due to rapid increase in temperature when the tail part is formed, in the predetermined or constant diameter part near the tail part.

18 Claims, 9 Drawing Sheets

METHOD FOR PRODUCING A SILICON SINGLE CRYSTAL AND THE SILICON SINGLE CRYSTAL PRODUCED THEREBY

BACKGROUND OF THE INVENTION

1. Field of the Invention

The present invention relates to a method for producing a tail portion in production of a silicon single crystal by Czochralski method (CZ method), and a silicon single crystal produced thereby.

2. Description of the Related Art

In a conventional method for producing a silicon single crystal by CZ method, a silicon single crystal as a seed crystal is contacted with a silicon melt, and is slowly pulled with rotating to grow a silicon single crystal ingot. A heater is provided around a quartz crucible and a graphite crucible containing the melt to heat the crucible while the single crystal is pulled.

In order to eliminate a dislocation propagated from slip dislocation generated in the seed crystal in high density due to thermal shock after the seed crystal is contacted with the silicon melt, a neck portion is formed by decreasing a diameter of the crystal to about 3 mm, namely, so-called necking is conducted. The diameter of crystal is then increased to a predetermined value to form a cone part, and subsequently a straight body of the single crystal having the predetermined diameter (hereinafter referred to as a predetermined or constant diameter portion) at a predetermined rate, and thereby a silicon single crystal ingot is pulled.

When the single crystal is grown to have a predetermined length, a tail end (a tail portion) of the single crystal is separated from the silicon melt. If the grown single crystal is simply separated from the melt, temperature at a separated portion of the single crystal rapidly decreases, and slip dislocation is generated in the single crystal, which lowers a rate of crystallization (yield of a predetermined diameter part of single crystal having no problem in quality).

To solve the above problem, the diameter of the crystal is gradually decreased after the predetermined diameter part of the single crystal is produced so that a contact area of the single crystal with the melt can be sufficiently decreased, and then the single crystal is separated from the melt. Generation of slip dislocation can be thus prevented. Generally, the part where the diameter is gradually decreased is called "a tail" or "a rounded part".

The tail part is conventionally formed by growing crystal with gradually increasing temperature of a melt by increasing quantity of heat supplied from a heater to a melt in a crucible, and with gradually decreasing a diameter of the crystal. However, in the method, the temperature of the melt after the tailing is so high that defects called OSF (Oxidation Induced Stacking Fault) is apt to generate in ring-like distribution (hereinafter may be referred to as OSF ring). Furthermore, temperature is changed much when the single crystal is separated from the melt, so that the single crystal is rapidly cooled and there is formed a part where an amount of precipitated oxygen is extraordinarily large (hereinafter occasionally referred to as extraordinary oxygen precipitation area).

In the tailing process, the pulling rate of single crystal is sometimes increased. However, it may result in separation of the rounded part halfway. Furthermore, since the pulling rate is rapidly increased to conduct the rounding process after the predetermined diameter part is grown, temperature changes rapidly, and the single crystal is thus cooled rapidly, which may lead to generation of slip dislocation, so that the extraordinary oxygen precipitation area may generate even in the predetermined diameter part.

SUMMARY OF THE INVENTION

The present invention has been accomplished to solve the above-mentioned problems, and a main object of the present invention is to provide a method for producing a silicon single crystal wherein productivity and yield of the silicon single crystal are improved by preventing the rapid lowering of temperature while the single crystal is separated from the melt in the tailing process to suppress generation of the part where the amount of precipitated oxygen is extraordinarily large and the OSF ring in the predetermined or constant diameter part near the tail part so as to increase the rate of crystallization, and the silicon single crystal produced by the method.

To achieve the above mentioned object, the present invention provides a method for producing a silicon single crystal by growing a silicon single crystal by Czochralski method wherein a pulling rate of a single crystal is gradually increased during formation of a tail part after formation of a predetermined diameter part of the single crystal.

As mentioned above, in a method for producing a tail part where a diameter is gradually decreased after forming a predetermined diameter part of the single crystal and before separating the single crystal from the melt to sufficiently decrease a contact area of the single crystal with the melt and thereby decrease a thermal shock on separation of the crystal from the melt, when the tail part is formed with gradually increasing the pulling rate of the single crystal based on the pulling rate during production of the predetermined diameter part, increase of temperature of the tail part can be mitigated and generation of OSF ring can be suppressed. Furthermore, it is not necessary to gradually increase the temperature of the melt as in the conventional method. Moreover, thermal shock is small even if the crystal is finally separated at the point contacting with the melt, so that an area with extraordinary large amount of precipitated oxygen can be suppressed in the predetermined diameter part near the tail part. Since the pulling rate is gradually increased, a rounded part is not halfway separated from the melt. Accordingly, the rate of crystallization is not lowered, and productivity and yield of the silicon single crystal can be improved.

It is preferable that the pulling rate is increased in the above-mentioned formation of the tail part so that the pulling rate at the end of formation of the tail part may be 1.1 to 5 times the pulling rate at the beginning of formation of the tail part.

As described above, when the pulling rate is gradually increased in formation of the tail part so that the pulling rate at the end of formation of the tail part may be 1.1 to 5 times of the pulling rate at the beginning of formation of the tail part, an increase in temperature of a tail part can be mitigated, so that generation of OSF ring can be prevented. Moreover, since a rapid decrease in temperature can be prevented when the tail part is finally separated from the melt, generation of the part where the amount of precipitated oxygen is extraordinary large can be suppressed.

Furthermore, when the pulling rate is increased rapidly, it may happen that the tip of the tail is halfway separated from the melt during the formation of the tail part. However, when the pulling rate is gradually increased with controlling it to be in the above range, the tail part can be formed easily without being halfway separated from the melt, so that the silicon single crystal can be produced stably.

In an embodiment of the present invention, the above-mentioned tail part can be produced with gradually increasing the pulling rate of the single crystal, and at the same time, raising a crucible containing a raw material melt.

By raising the crucible containing the melt while the pulling rate is gradually increased, rapid lowering of the level of the melt can be suppressed, so that possibility of halfway separation of the tail part during formation thereof can be lowered further, and rapid change in temperature can be prevented, and thereby extraordinary oxygen precipitation can be prevented. As a result, productivity and yield of the silicon single crystal can be improved.

In another embodiment of the present invention, length t of the tail part is defined to be a or more, wherein a represents a distance from the tip end of the tail part to a position of the extraordinary oxygen precipitation area when the tail part is formed after the predetermined diameter part is grown, in production of the silicon single crystal by Czochralski method.

As described above, when the tail part is formed by pulling the crystal to have the length t of a or more, wherein a represents a distance from the tip end of the tail part to a position of the extraordinary precipitation area in formation of the tail part where the diameter is gradually decreased after forming a predetermined diameter part of the single crystal and before separating the single crystal from the melt to sufficiently decrease a contact area of the single crystal with the melt and thereby decrease a thermal shock on separation of the crystal from the melt, the extraordinary oxygen precipitation area is held within the tail part so that generation of extraordinary oxygen precipitation in the predetermined diameter part near the tail part can be prevented. Furthermore, since the melt is not heated rapidly during formation of the tail part, generation of OSF ring can be suppressed. Accordingly, quality of the predetermined diameter part can be improved without lowering the rate of crystallization, and thus productivity and yield of the silicon single crystal can be improved.

When the length t of the tail part is defined to be in the range from a to 1.5a, wherein a represents a distance from the tip end of the tail part to the position of the extraordinary precipitation area in formation of the tail part, the extraordinary oxygen precipitation area can be surely held within the tail part, and time for formation of the tail part is not longer than necessary.

In another embodiment of the present invention, the length t of the tail part is defined to be longer than the diameter d of the predetermined diameter part of the single crystal (t>d).

When the tail part is pulled to have the length t which is longer than the diameter d of the predetermined diameter part of the single crystal as described above, rapid increase in temperature of the tail part can be surely mitigated, so that generation of OSF ring can be prevented. Furthermore, even when the crystal is separated at the point contacted with the melt, thermal shock is small, so that it is easy to hold the part where amount of precipitated oxygen is extraordinarily large within the tail part. Accordingly, the possibility of generation of the part where amount of precipitated oxygen is extraordinarily large in the predetermined diameter part near the tail part can be lowered.

The present invention also relates to silicon single crystals produced by the above mentioned method.

In the single crystal ingot produced by the above-mentioned method, particularly in the predetermined diameter part near the tail part, generation of the extraordinary oxygen precipitation area or OSF ring can be prevented almost completely and defect density is extremely low, so that the silicon single crystal having high quality over all length can be obtained.

According to the present invention, there can be suppressed generation of the extraordinary oxygen precipitation area due to thermal shock on separation of the tail part of the silicon single crystal and generation of the OSF ring due to rapid increase in temperature for formation of the tail part, and thereby productivity, yield and cost for producing silicon single crystals can be significantly improved.

DESCRIPTION OF THE INVENTION AND A PREFERRED EMBODIMENT

Figure 1A:
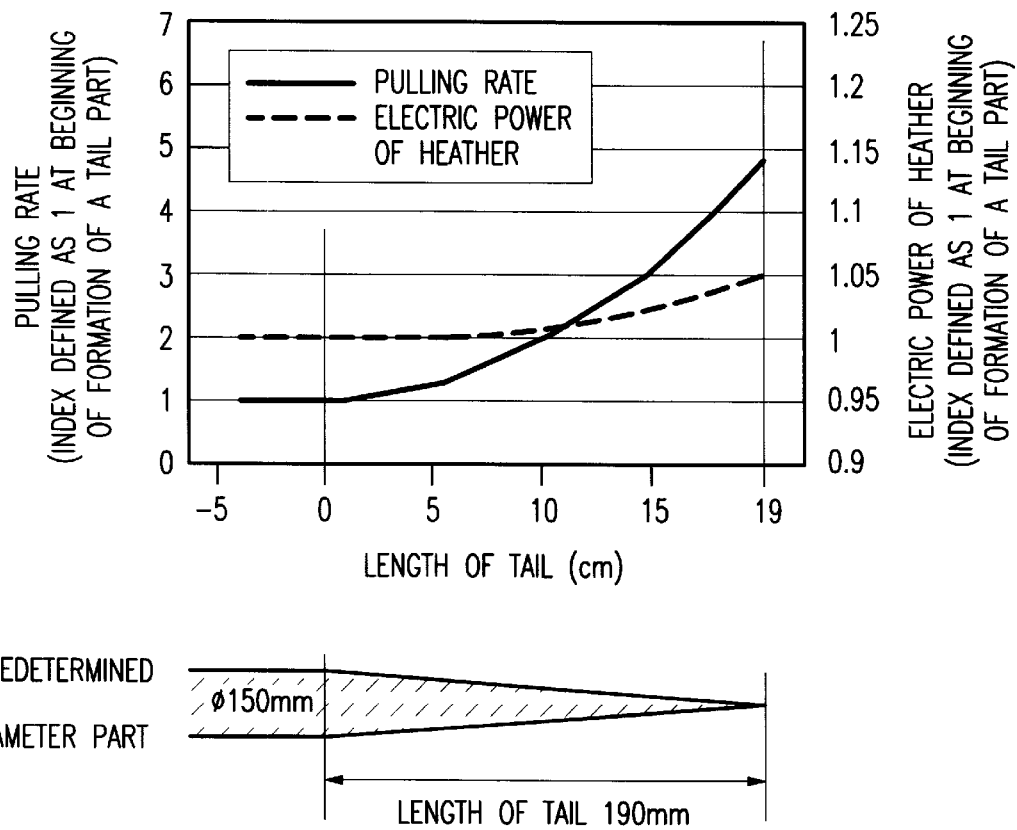
FIG. 1 is a graph showing conditions for producing a tail part of a silicon single crystal of the present invention and amount of precipitated oxygen in a predetermined diameter part of the single crystal, (a) shows pulling rate and the electric power of the heater during formation of the tail portion, (b) shows amount of precipitated oxygen in the predetermined diameter part of the single crystal.

The present invention and embodiments thereof will now be described. However, the invention is not limited thereto.

The inventors of the present invention have researched and studied a method for producing a tail part where there can be suppressed generation of an extraordinary oxygen precipitation area in a predetermined or a constant diameter part near the tail part due to thermal shock with rapid decrease in temperature when the tip end of the tail is separated from the melt, and generation of OSF ring and the like due to rapid increase in temperature as a result of heating with a heater in the final tail part producing process, in production of a silicon single crystal. As a result, the inventors have found that the object of the present invention can be achieved by gradually increasing a pulling rate of the single crystal when a tail part is formed, or by forming a tail part having a length t which is not less than a, in which a represents a distance from a tip end of the tail to a position of an extraordinary oxygen precipitation area, and studied further each of conditions to complete the present invention.

The present invention is characterized in that a pulling rate of a silicon single crystal is gradually increased during formation of a tail part after formation of a predetermined diameter part of the single crystal in production of the silicon single crystal by Czochralski method.

As mentioned above, in a method for producing a tail part where a diameter is gradually decreased after forming a predetermined diameter part of the single crystal and before separating the single crystal from the melt to sufficiently decrease a contact area of the single crystal with the melt and thereby decrease a thermal shock on separation of the crystal from the melt, when the tail part is formed with gradually increasing the pulling rate of the single crystal based on the pulling rate during production of the predetermined diameter part, it is not necessary to gradually increase the temperature of the melt as in the prior art, so that an increase in temperature at the tail part can be mitigated, and generation of OSF ring can be suppressed. Moreover, thermal shock is small even when the crystal is finally separated at the point contacting with the melt, so that the part where amount of precipitated oxygen is extraordinary large can be suppressed in the predetermined diameter part near the tail part. Accordingly, quality of the predetermined diameter part is not lowered, and productivity and yield of the silicon single crystal can be improved.

It is preferable that the pulling rate is gradually increased in the above-mentioned method so that the pulling rate at the end of formation of the tail part may be 1.1 to 5 times of the pulling rate at the beginning of formation of the tail part.

As described above, when the pulling rate is gradually increased so that the pulling rate at the time when the length of the tail part reaches a predetermined value may be 1.1 to 5 times of the pulling rate at the beginning of formation of the tail part, an increase in temperature of a tail part can be mitigated, so that generation of OSF ring can be prevented, and rapid decrease in temperature can be prevented even when the crystal is finally separated at the point contacting with the melt, so that generation of the extraordinary oxygen precipitation area can be suppressed.

When the accelerated rate of the pulling rate is less than 1.1, the tail part having a diameter which is sufficiently decreased cannot be formed only with the pulling rate, so that it is necessary to increase the temperature of the melt. Accordingly, the temperature of the crystal is also increased, and therefore, temperature at the tail part is decreased rapidly on separation of the tail part from the melt so that extraordinary oxygen precipitation cannot be prevented sufficiently in some cases. When the accelerated rate of the pulling rate is more than 5, the single crystal is apt to be separated halfway from the melt during formation of the tail part. Accordingly, it is preferable that the pulling rate is gradually increased with controlling it in the above-mentioned range.

FIG. 1(a) shows one example in which the pulling rate is increased while the tail part is produced. The tail having a length of 190 mm was pulled with quadratically increasing the pulling rate by 4.7 times. As a result, amount of precipitated oxygen in the predetermined diameter part of the single crystal (FIG. 1(b)) was almost homogenous, and an area where amount of precipitated oxygen is extraordinary large is not present. In single crystals shown in FIG. 1 to FIG. 6, scales of ordinate and abscissa are different.

As other methods for increasing the pulling rate than the above-mentioned method of quadratically increasing the pulling rate, there are methods of increasing the pulling rate stepwise or linearly, which can afford almost equivalent effect to that of the above-mentioned method.

Figure 2A:
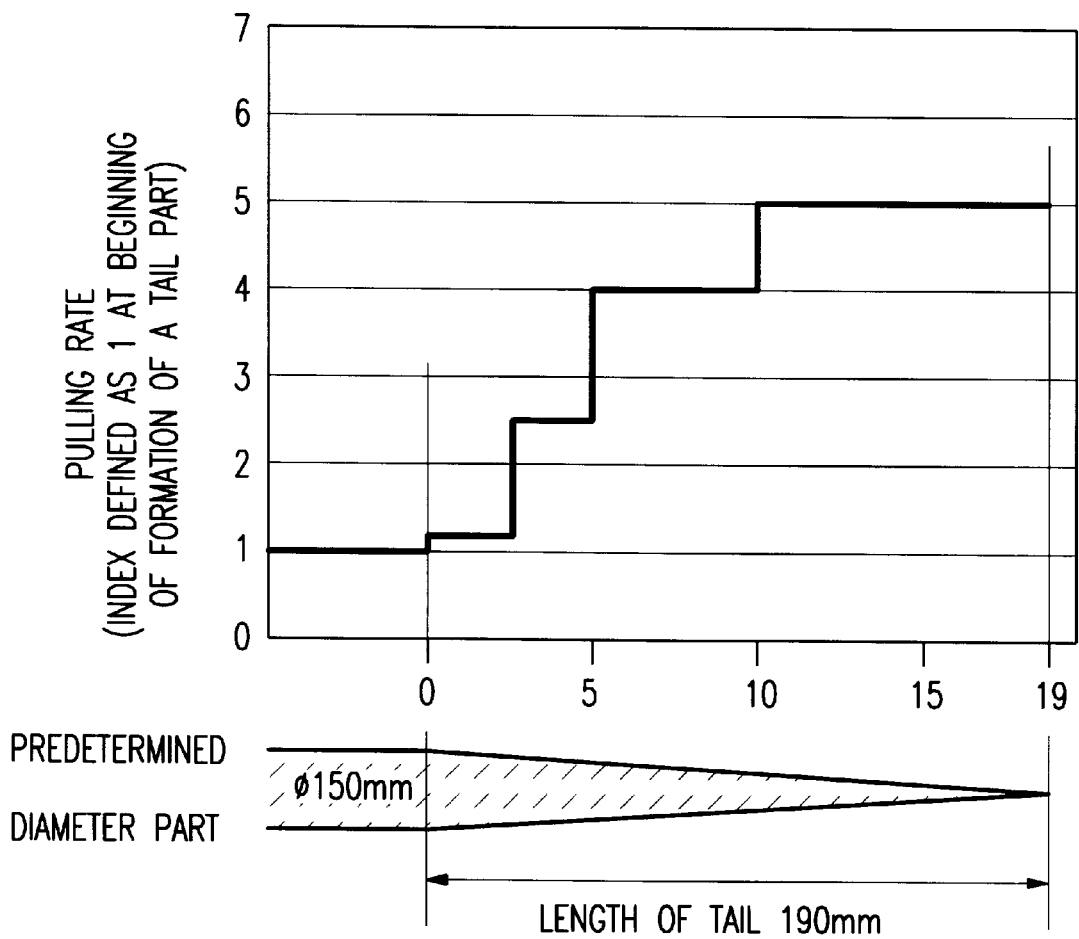
FIG. 2 is a graph showing conditions for producing a tail part of a silicon single crystal of the present invention and amount of precipitated oxygen in a predetermined diameter part of the single crystal, (a) shows pulling rate which is varied stepwise during formation of the tail portion, (b) shows amount of precipitated oxygen in the predetermined diameter part of the single crystal.

FIG. 2(a) shows an example wherein tail part having a length of 190 mm was pulled with stepwise increasing the pulling rate by 5 times in four steps. The amount of precipitated oxygen in the predetermined diameter part of the single crystal (FIG. 2(b)) was approximately equivalent to that obtained by the method of accelerating quadratically.

In a preferred embodiment of the present invention, the above-mentioned tail part can be produced with gradually increasing the pulling rate of the single crystal, and at the same time, raising a crucible containing a melt.

By raising the crucible containing the melt while the pulling rate is gradually increased in formation of the tail part, rapid lowering of the level of the melt can be mitigated, so that possibility of separation of the tail part during formation thereof can be lowered further, and rapid change in temperature can be prevented, and thereby extraordinary oxygen precipitation can be prevented further. Accordingly, productivity and yield of the silicon single crystal can be improved.

In the method for producing the tail part of the present invention, electric power of the heater heating the raw material melt contained in the crucible during formation of the tail can be almost equivalent to that during formation of the predetermined diameter part, or can be increased by approximately 5% in latter half of production of the tail in order to form the tail part. Accordingly, temperature of the tail part is not increased, and thermal shock on separation of the tip end of the tail from the melt can be cushioned. When the temperature is increased together with gradually increasing the pulling rate during formation of the tail, the degree of increase in temperature should be defined appropriately considering the degree of increase of the pulling rate.

Furthermore, the inventors of the present invention have studied the relation between conditions of a conventional method for producing a tail part and the position of the extraordinary oxygen precipitation area, and have made experiments repeatedly to establish the condition for producing the tail part.

The factor they have studied first is the relation between the diameter of the predetermined diameter portion of the single crystal and the position of the extraordinary oxygen precipitation area.

Figure 6:
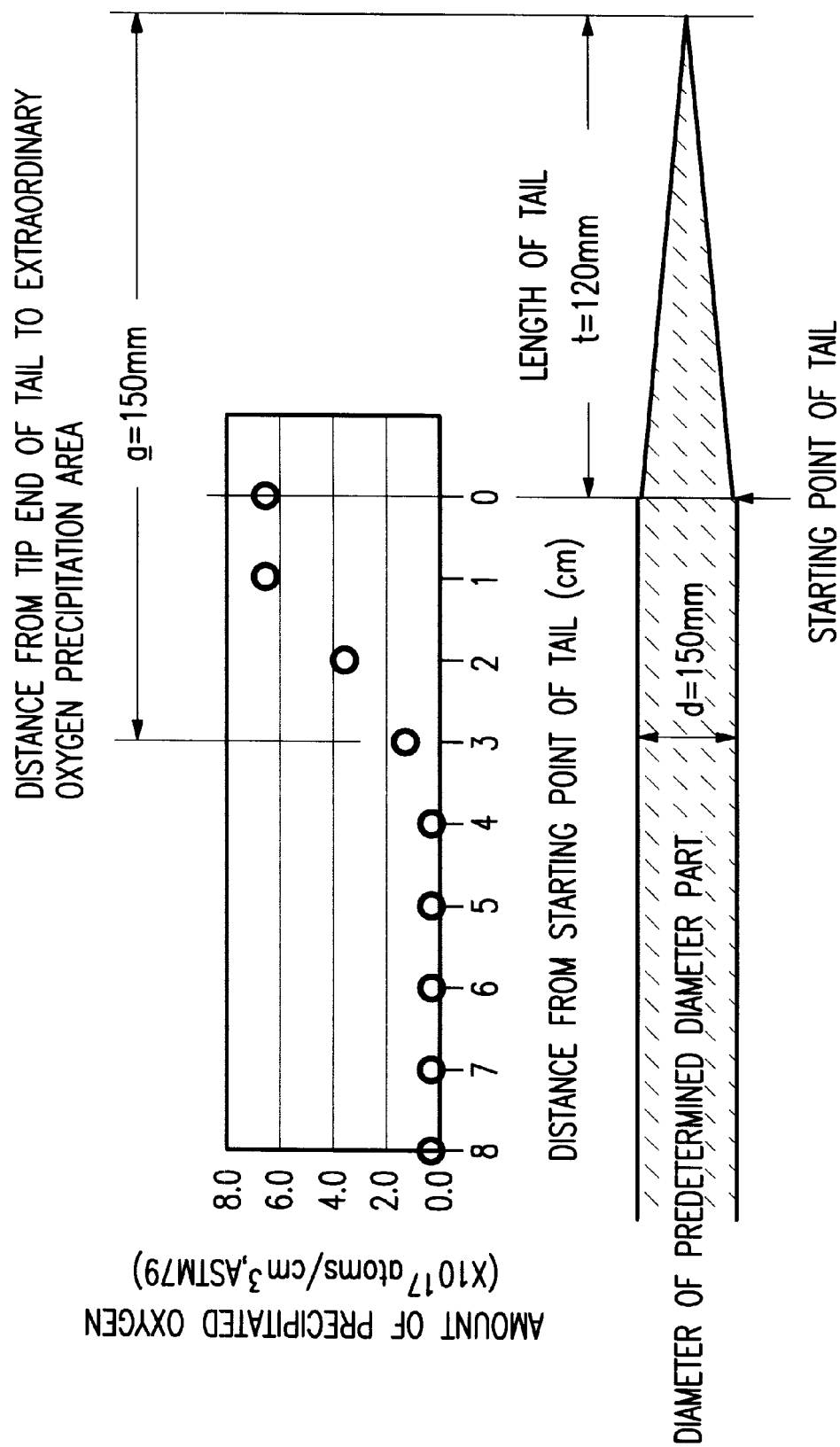
FIG. 6 is a graph showing conventional conditions for producing a tail part of a silicon single crystal and amount of precipitated oxygen in a predetermined diameter part of the single crystal.

FIG. 6 is an explanatory view of one example showing the position of an extraordinary oxygen precipitation in a predetermined diameter part before forming the tail part, when a single crystal having a diameter of the predetermined diameter part d of 150 mm and a length of the tail part t of 120 mm was produced according to a conventional CZ method. It shows that extraordinary oxygen precipitation started at 3 cm ahead of the starting point of the tail part and reached the peak at 1 cm ahead of the same point.

The relation between the distance a from the tip end of the tail to the position of the extraordinary oxygen precipitation area and the diameter d of the predetermined diameter part of the single crystal was then studied at each furnace of CZ apparatus, and the obtained data was analyzed. The result is shown in FIG. 5.

Figure 5:
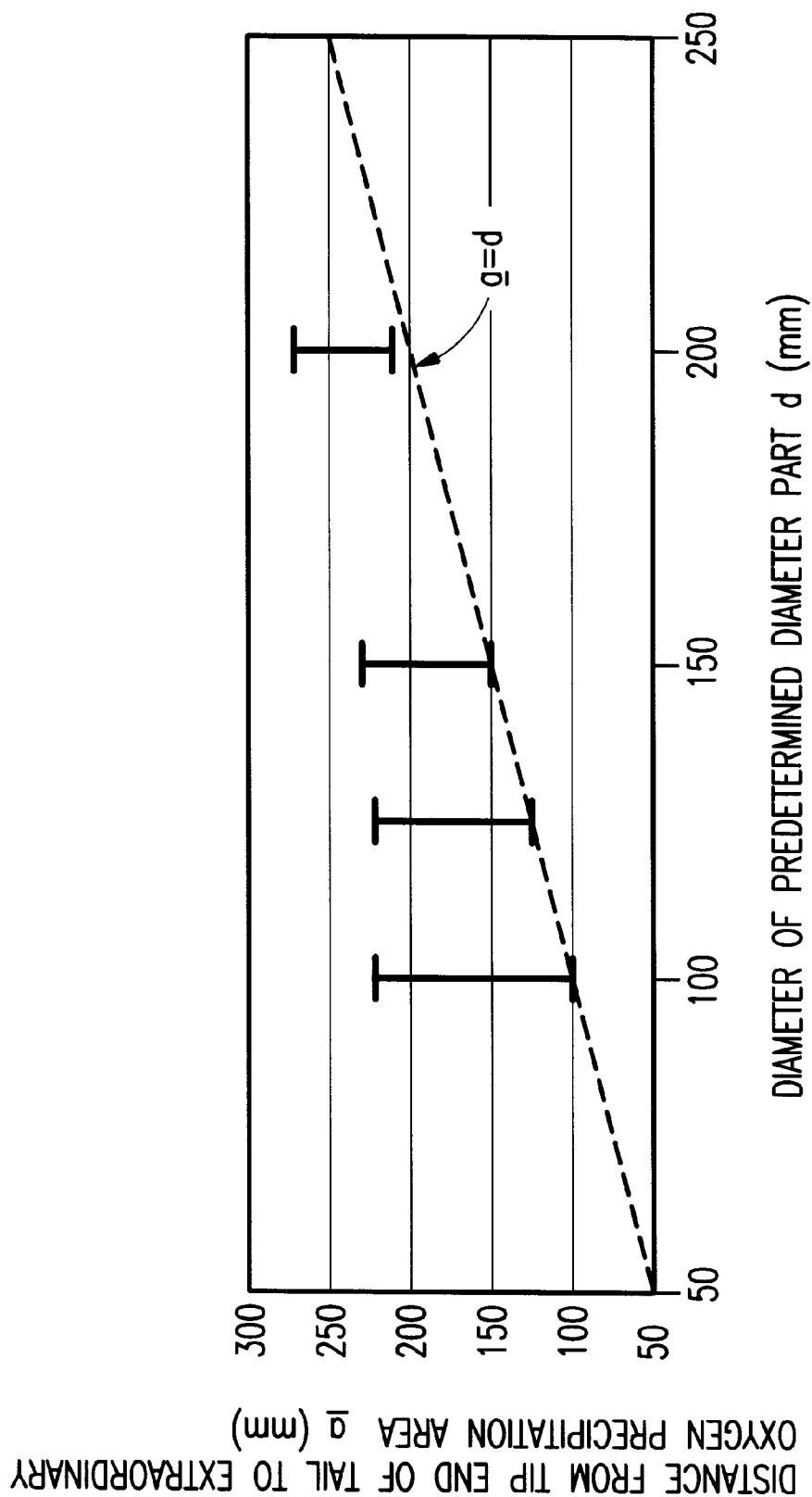
FIG. 5 is a graph showing a correlation between the diameter d of a predetermined diameter part of a silicon single crystal and the distance a from the tip end of a tail part to the position of an extraordinary oxygen precipitation area.

FIG. 5 clearly shows that all of the positions of generation of the extraordinary oxygen precipitation area a are positively correlative with the diameter d of the predetermined diameter part. Furthermore, a is deviated, and d is the lower limit thereof. The reason why deviation is present is difference in diameter of the predetermined diameter part of the single crystal, conditions for producing the predetermined diameter part and the tail part (temperature of the melt, the pulling rate or the like), the structure in the furnace of CZ apparatus and the like. However, even when a is the smallest, a is not shorter than the diameter d of the predetermined diameter part.

The position of a from the tip end of the tail wherein a=d is equal to the length t of the tail part. Accordingly, if the tail part is formed so that the length t of the tail part may be a or more, almost no extraordinary oxygen precipitation area generates in the predetermined diameter part near the tail part.

However, if the length of the tail part is longer than necessary, the rate of crystallization will be lowered, and producing time will be longer. Therefore, the length of the tail part is preferably a to 1.5a.

Figure 4:
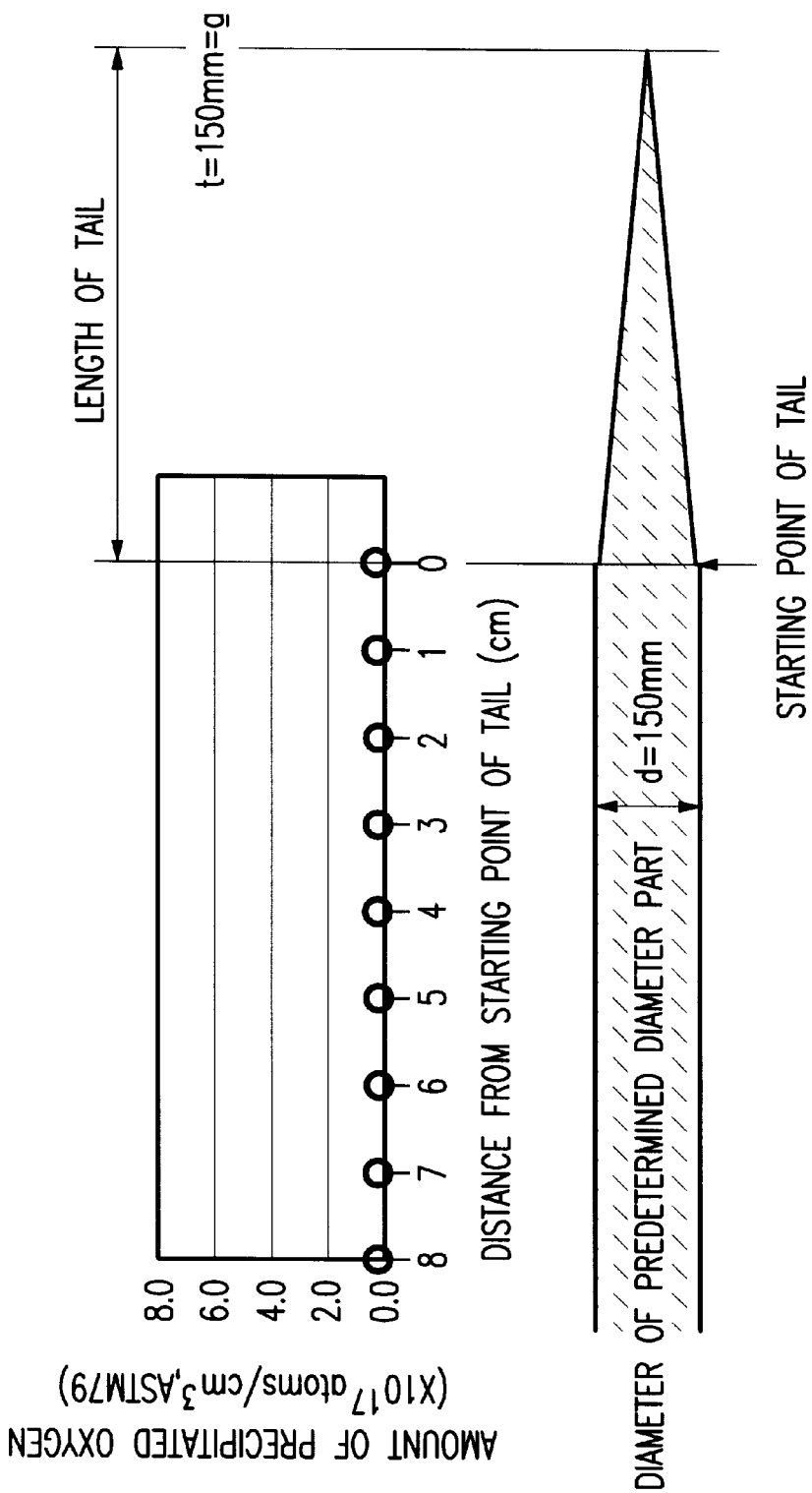
FIG. 4 is a graph showing conditions for producing a tail part of a silicon single crystal of the present invention and amount of precipitated oxygen in a predetermined diameter part of the single crystal.

In FIG. 4, t and a fulfill the requirement of t≧a. Namely, the tail part was formed in the length t=150 mm, which is equal to a=150 mm corresponding to a distance from the tip end of the tail part to the position of the extraordinary oxygen precipitation area determined in FIG. 6. As shown in FIG. 4, almost no extraordinary oxygen precipitation area generated in the predetermined diameter part of the single crystal. The reason is likely that the extraordinary oxygen precipitation area generated in the tail part.

In order to form the tail part having the length defined in the present invention, it is necessary to know the accurate value of the distance a from the tip end of the tail part to the position of the extraordinary oxygen precipitation area. The value a is almost constant in each of the condition for producing the predetermined diameter part of the single crystal in each furnace of CZ apparatus, in each condition for producing the tail part and in each furnace structure of CZ apparatus. Accordingly, the value a can be defined by examining amount of precipitated oxygen in each condition, and the tail part can be formed according to the value considering safety factor in some extent.

According to the present invention, a tail part is preferably formed so that the length t of the tail part is longer than a diameter d of the predetermined diameter part.

As described above, the distance a from the tip end of the tail part to the position where extraordinary oxygen precipitation disappears is equal to d or more (a≧d) as shown in FIG. 5. Accordingly, when the tail part is formed in the length t not less than d, generation of the extraordinary oxygen precipitation area in the predetermined diameter part near the tail part can be prevented.

As described above, in a producing a tail part whose diameter is gradually decreased after forming a predetermined diameter part of the single crystal and before separating the single crystal from the melt to decrease a contact area of the single crystal with the melt and thereby decrease a thermal shock on separation of the crystal from the melt, when the tail part is pulled to have the length t which is longer than the diameter d of the predetermined diameter part of the single crystal generation of extraordinary oxygen precipitation area or OSF ring can be suppressed in the predetermined diameter part near the tail part. Accordingly, quality of the predetermined diameter part of the single crystal can be improved, and thus productivity and yield of the silicon single crystal can be improved.

In a silicon single crystal ingot produced by the above-mentioned methods for producing a tail part, generation of slip dislocation in a predetermined diameter part near the tail part, generation of an area where amount of precipitated oxygen is extraordinarily large, generation of OSF ring and the like can be prevented almost completely, and defect density is extremely low, so that the silicon single crystal having high quality over all length can be obtained.

EXAMPLE

The following examples and comparative examples are being submitted to further explain the present invention. These examples are not intended to limit the scope of the present invention.

Amount of precipitated oxygen is determined by slicing off wafer from each part in the predetermined diameter part, and subjecting it to a heat treatment at 650° C. for 2 hours in an atmosphere of nitrogen and a heat treatment at 1000° C. for 16 hours in an atmosphere of oxygen, and shown as ASTM'79 value.

Example 1

A single crystal having a diameter of a predetermined diameter part, d=150 mm and a length of a tail part, t=190 mm was produced by CZ method. First, the predetermined diameter part having a diameter of 150 mm was produced at the pulling rate of F mm/min, and then the tail part was formed as shown in FIG. 1(a). The pulling rate of the tail part was gradually increased. It was F mm/min at beginning of formation of the tail part, and was 4.7 F mm/min at the end of formation of the tail part. Electric power of the heater was H kW at beginning of formation of the tail part, and was 1.05 H kW at the end of formation of the tail part, so that electric power used for formation of the tail part can be reduced by 13% compared to a conventional method.

Figure 1B:
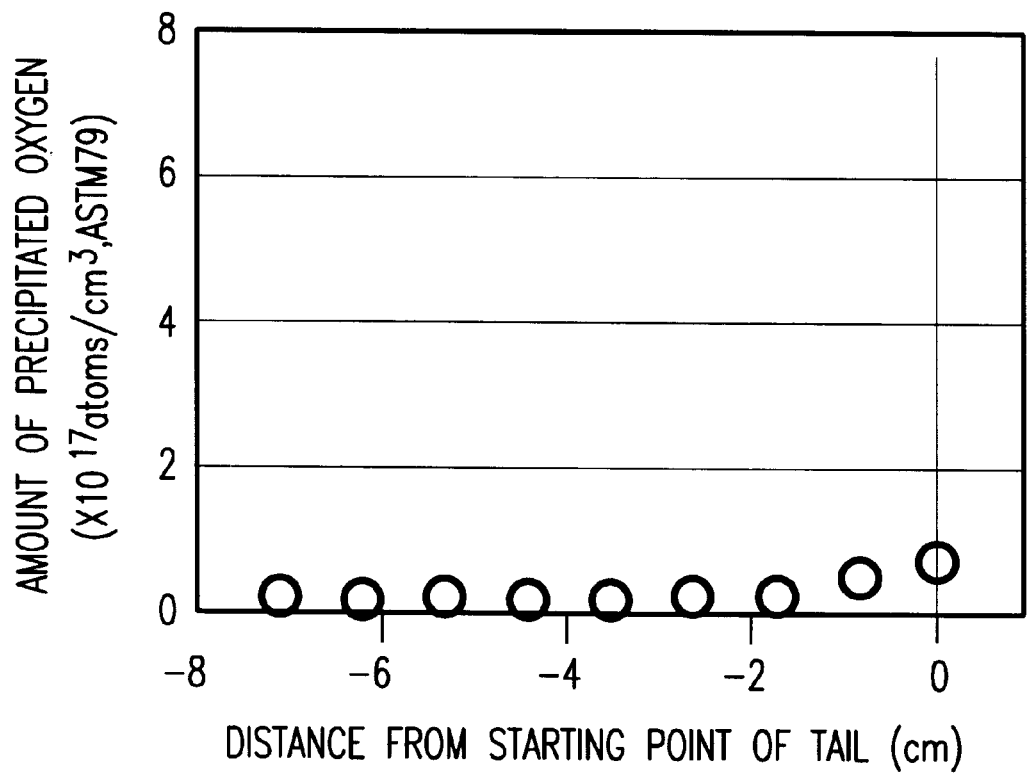
Figure 1B:
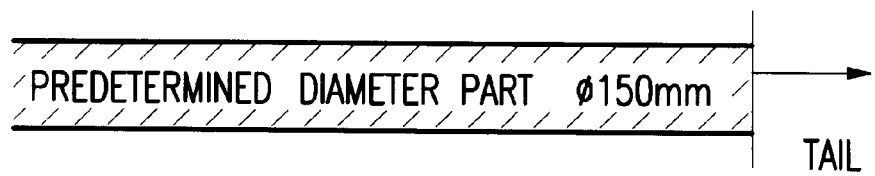

Amount of precipitated oxygen was measured from the position of 8 cm ahead of the starting point of the tail part. Although it was slightly increased at 1 cm ahead of the starting point of the tail part, it was almost constant in other part, as shown in FIG. 1(b).

Example 2

A single crystal having a diameter of a predetermined diameter part, d=150 mm and a length of a tail part, t=190 mm was produced by CZ method. First, the predetermined diameter part having a diameter of 150 mm was produced at the pulling rate of F mm/min, and then the tail part was formed as shown in FIG. 2(a). The pulling rate of the tail part was gradually increased. It was F mm/min at beginning of formation of the tail part, and was 5.0 F mm/min at the end of formation of the tail part. Electric power of the heater was H kW at beginning of formation of the tail part, and was 1.05 H kW at the end of formation of the tail part, so that electric power used for formation of the tail part can be reduced by 13% compared to a conventional method.

Figure 2B:
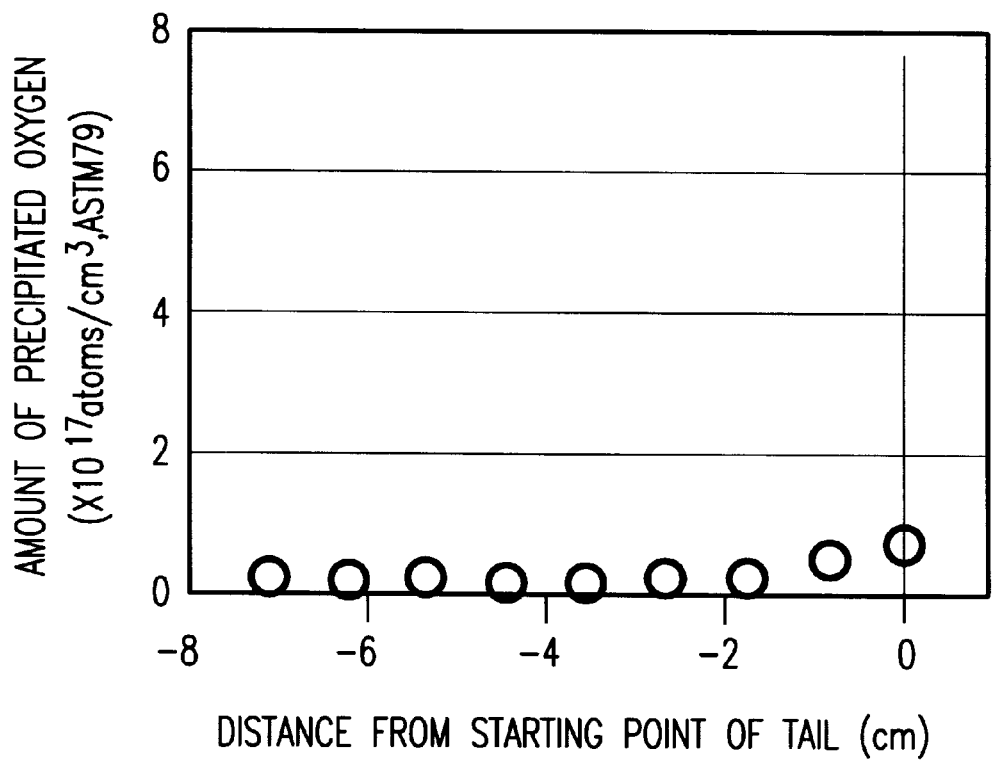
Figure 2B:
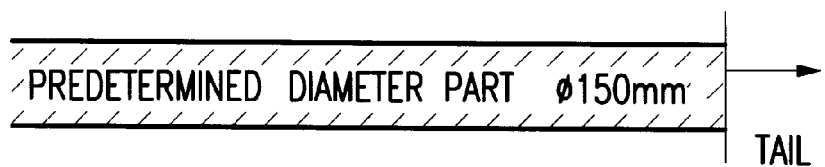

Amount of precipitated oxygen was measured from the position of 8 cm ahead of the starting point of the tail part. Although it was slightly increased at 1 cm ahead of the starting point of the tail part, it was almost constant in other part, as shown in FIG. 2(b).

Comparative Example 1

Figure 3A:
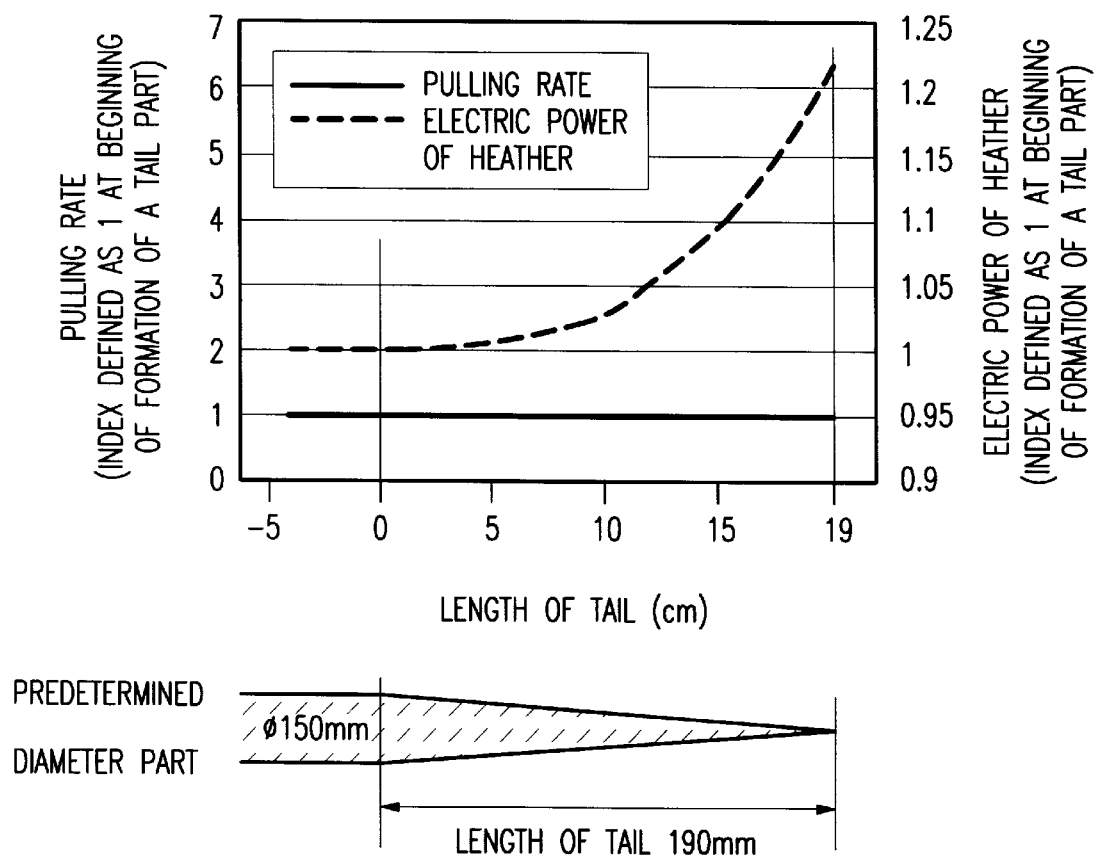
FIG. 3 is a graph showing conventional conditions for producing a tail part of a silicon single crystal and amount of precipitated oxygen in a predetermined diameter part of the single crystal, (a) shows pulling rate and the electric power of the heater during formation of the tail portion, (b) shows amount of precipitated oxygen in the predetermined diameter part of the single crystal.

A single crystal having a diameter of a predetermined diameter part, d=150 mm and a length of a tail part, t=190 mm is produced by CZ method. First, the predetermined diameter part having a diameter of 150 mm was produced at the pulling rate of F mm/min, and then the tail part is formed as shown in FIG. 3(a). The pulling rate of the tail part was F mm/min at the beginning, and it was kept to be constant until the end of formation of the tail part.

Electric power of the heater began to increase at about 4 cm ahead of the starting point of the tail part, and it was 1.2 times that of pulling of the predetermined diameter part at the end of formation of the tail part, i.e., at 19 cm from the starting point of the tail part.

Figure 3B:
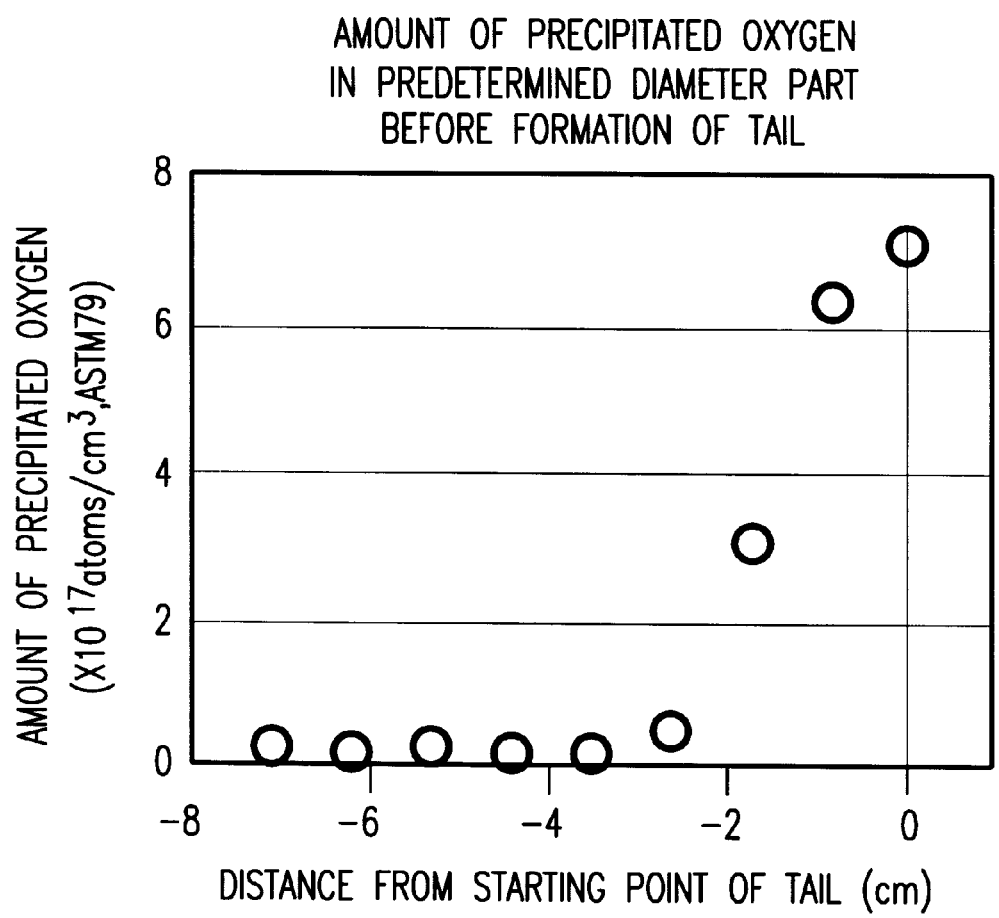
Figure 3B:
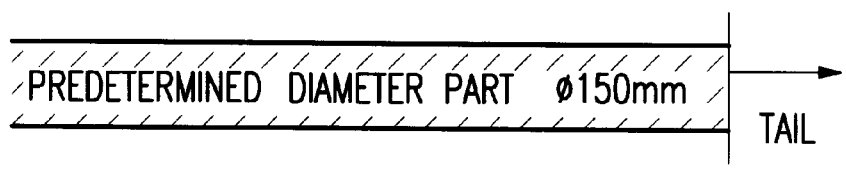

Amount of precipitated oxygen began to rapidly increase at 3 cm ahead of the starting point of the tail part, and it was extraordinarily large as $7.2 \times 10^{17}$ atoms/cm$^3$ as shown in FIG. 3(b). The value was shown as ASTM'79.

Example 3

A single crystal having a diameter of a predetermined diameter part, d=150 mm and a length of a tail part, t=150 mm (t≧d) was produced by CZ method. Amount of precipitated oxygen in the predetermined diameter part was measured from the point of 80 mm from the starting point of formation of the tail part to the starting point of the tail part. No extraordinary oxygen precipitation was observed over all the measured area as shown in FIG. 4.

It was also clear that the length of the tail part, t=150 mm is almost the same as the distance from the position of the extraordinary oxygen precipitation area to the tip end of the tail part, a=150 mm (t≧a).

Comparative Example 2

A single crystal having a diameter of a predetermined diameter part, d=150 mm and a length of a tail part, t=120 mm was produced by CZ method (t<d). Amount of precipitated oxygen in the predetermined diameter part was measured from the point of 80 mm ahead of the starting point of formation of the tail part to the starting point of the tail part. The extraordinary oxygen precipitation area was present from the point of 30 mm ahead of the starting point of formation of the tail part to the starting point as shown in FIG. 6.

The distance a from a tip end of the tail part to the position of the extraordinary precipitation area was 150 mm [t(=120 mm)<a (=150 mm)]. Extraordinary oxygen precipitation in the predetermined diameter part cannot be prevented.

The present invention is not limited to the above-described embodiment. The above-described embodiment is a mere example, and those having the substantially same structure as that described in the appended claims and providing the similar action and effects are included in the scope of the present invention.

For example, the silicon single crystal having the diameter of 150 mm (6 inches) was grown in the embodiment of the present invention. However, the present invention can be applied to the crystal produced recently having a diameter of 200 mm (8 inches) to 400 mm (16 inches), or more.

Furthermore, the present invention can be applied not only to general Czochralski method, but also to MCZ method (Magnetic Field Applied Czochralski Crystal Growth Method) wherein a magnetic field is applied. In the specification of the present invention, therefore, the term of Czochralski method also means not only general Czochralski method, but also so-called MCZ method.

What is claimed is:

1. A method for producing a silicon single crystal by growing a silicon single crystal by Czochralski method wherein a pulling rate of a single crystal is gradually increased during formation of a tail part after formation of a constant diameter part of the single crystal.

2. The method for producing the silicon single crystal according to claim 1 wherein the pulling rate is gradually increased so that a pulling rate at the end of formation of the tail part may be 1.1 to 5 times a pulling rate at the beginning of formation of the tail part during formation of the tail part.

3. The method for producing the silicon single crystal according to claim 2 wherein the tail part is produced with gradually increasing the pulling rate of the single crystal, and at the same time, raising a crucible containing a melt.

4. The method for producing the silicon single crystal according to claim 2 wherein the length t of the tail part is defined to be longer than the diameter d of the constant diameter part of the single crystal (t>d) when the tail part is formed.

5. A silicon single crystal produced by the method of claim 4.

6. A silicon single crystal produced by the method of claim 2.

7. The method for producing the silicon single crystal according to claim 1 wherein the tail part is produced with gradually increasing the pulling rate of the single crystal, and at the same time, raising a crucible containing a melt.

8. The method for producing the silicon single crystal according to claim 1 wherein the length t of the tail part is defined to be longer than the diameter d of the constant diameter part of the single crystal (t>d) when the tail part is formed.

9. A silicon single crystal produced by the method of claim 8.

10. A silicon single crystal produced by the method of claim 1.

11. A method for producing a silicon single crystal wherein length t of a tail part is defined to be a or more, wherein a represents a distance from the tip end of the tail part to a position of the extraordinary oxygen precipitation part when the tail part is formed after the constant diameter part is grown, in production of the silicon single crystal by Czochralski method.

12. The method for producing the silicon single crystal according to claim 11 wherein the length t of the tail part is defined to be in the range from a to 1.5a, wherein a represents a distance from the tip end of the tail part to the position of the extraordinary precipitation part when the tail part is formed.

13. The method for producing the silicon single crystal according to claim 12 wherein the length t of the tail part is defined to be longer than the diameter d of the constant diameter part of the single crystal (t>d) when the tail part is formed.

14. A silicon single crystal produced by the method of claim 13.

15. A silicon single crystal produced by the method of Claim 12.

16. The method for producing the silicon single crystal according to claim wherein the length t of the tail part is defined to be longer than the diameter d of the constant diameter part of the single crystal (t>d) when the tail part is formed.

17. A silicon single crystal produced by the method of claim 16.

18. A silicon single crystal produced by the method of claim 11.

* * * * *